(12) United States Patent
Matsumoto et al.

(10) Patent No.: US 9,240,379 B2
(45) Date of Patent: Jan. 19, 2016

(54) SEMICONDUCTOR DEVICE MANUFACTURING METHOD FOR SUPPRESING WIRING MATERIAL FROM BEING DIFFUSED INTO INSULATING FILM, STORAGE MEDIUM AND SEMICONDUCTOR DEVICE

(71) Applicant: Tokyo Electron Limited, Tokyo (JP)

(72) Inventors: Kenji Matsumoto, Nirasaki (JP); Tatsufumi Hamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/464,875

(22) Filed: Aug. 21, 2014

(65) Prior Publication Data
US 2014/0361436 A1 Dec. 11, 2014

Related U.S. Application Data

(63) Continuation of application No. PCT/JP2013/053581, filed on Feb. 14, 2013.

(30) Foreign Application Priority Data

Feb. 22, 2012 (JP) .................. 2012-036735

(51) Int. Cl.
*H01L 23/532* (2006.01)
*H01L 21/768* (2006.01)

(52) U.S. Cl.
CPC ...... *H01L 23/53238* (2013.01); *H01L 21/7684* (2013.01); *H01L 21/76814* (2013.01); *H01L 21/76843* (2013.01); *H01L 21/76846* (2013.01); *H01L 21/76855* (2013.01); *H01L 21/76858* (2013.01); *H01L 21/76883* (2013.01); *H01L 23/53295* (2013.01); *H01L 2924/0002* (2013.01)

(58) Field of Classification Search
CPC .................. H01L 23/53238; H01L 21/7684; H01L 21/76843; H01L 21/76883; H01L 2/76855; H01L 2/76858; H01L 2/76814; H01L 23/53295
See application file for complete search history.

(56) References Cited

U.S. PATENT DOCUMENTS 7,687,918 B2 * 3/2010 Kunimune et al. ........... 257/774
2002/0022365 A1 * 2/2002 Ohba ............................ 438/675

(Continued)

FOREIGN PATENT DOCUMENTS

| JP | 2005-277390 A | 10/2005 |
| JP | 2011-066274 A | 3/2011 |
| JP | 2012-009617 A | 1/2012 |

(Continued)

OTHER PUBLICATIONS

International Search Report for PCT/JP2013/053581 dated May 28, 2013.

*Primary Examiner* — William Coleman
(74) *Attorney, Agent, or Firm* — Pearne & Gordon LLP

(57) ABSTRACT

A semiconductor device manufacturing method includes forming a second conductive layer on an underlying layer which has an insulating layer in which a recess is formed and a first conductive layer exposed on a bottom surface of the recess; forming a third conductive layer on the second conductive layer; supplying, into the third conductive layer, a material solid-soluble in the third conductive layer; and heating the third conductive layer into which the solid-soluble material is supplied.

1 Claim, 3 Drawing Sheets

(56) References Cited

U.S. PATENT DOCUMENTS

2012/0025380 A1 2/2012 Neishi et al.
2012/0219724 A1 8/2012 Neishi et al.

FOREIGN PATENT DOCUMENTS

| WO | 2010/116889 A1 | 10/2010 |
| WO | 2011/037090 A1 | 3/2011 |

* cited by examiner

SEMICONDUCTOR DEVICE MANUFACTURING METHOD FOR SUPPRESING WIRING MATERIAL FROM BEING DIFFUSED INTO INSULATING FILM, STORAGE MEDIUM AND SEMICONDUCTOR DEVICE

CROSS-REFERENCE TO RELATED APPLICATION

This application claims the benefit of Japanese Patent Application No. 2012-036735 filed on Feb. 22, 2012, the entire disclosures of which are incorporated herein by reference.

TECHNICAL FIELD

The embodiments described herein pertain generally to a semiconductor device manufacturing method, a storage medium and a semiconductor device.

BACKGROUND

In general, a multilayer wiring structure of a semiconductor device is formed by burying a metal wiring in a groove of an interlayer insulating film. The metal wiring is typically made of a material containing copper (Cu) having low electromigration and low electric resistance. When using the material containing Cu, a (diffusion) barrier layer made of tantalum (Ta) or tantalum nitride (TaN) is used to suppress copper from being diffused into an underlying layer.

Recently, various developments have been made for the purposes of improving reliability of the barrier layer. To this end, a self-formation barrier layer using a manganese (Mn) film or a CuMn alloy film, instead of a Ta film or TaN film, is attracting attention (see, for example, Patent Document 1).
Patent Document 1: Japanese Patent Laid-open Publication No. 2005-277390
Patent Document 2: Japanese Patent Laid-open Publication No. 2011-066274

In a method described in Patent Document 1, for example, a Cu film is formed on an insulating film and, then, a Mn-containing film is formed thereon in order to form a self-formation barrier layer. When burying Cu in a groove portion (trench or via hole) of the insulating film, however, it may be difficult to bury the Cu with high coverage through a PVD method in case of forming a fine wiring having a trench width equal to or less than, e.g., about 50 nm. Furthermore, since the Cu is in direct contact with the insulating film for a long time, the Cu may be diffused into the insulating film.

SUMMARY

In view of the foregoing problems, example embodiments provide a semiconductor device manufacturing method capable of buying a wiring material in a groove of an insulating film with high coverage, so that the wiring material is suppressed from being diffused into the insulating film.

In one example embodiment, a semiconductor device manufacturing method includes forming a second conductive layer on an underlying layer which has an insulating layer in which a recess is formed and a first conductive layer exposed on a bottom surface of the recess; forming a third conductive layer on the second conductive layer; supplying, into the third conductive layer, a material solid-soluble in the third conductive layer; and heating the third conductive layer into which the solid-soluble material is supplied.

In accordance with the example embodiment, it is possible to provide a semiconductor device manufacturing method capable of buying a wiring material in a groove of an insulating film with high coverage, so that it is possible to suppress the wiring material from being diffused into the insulating film.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

EXPLANATION OF CODES

Figure 1:
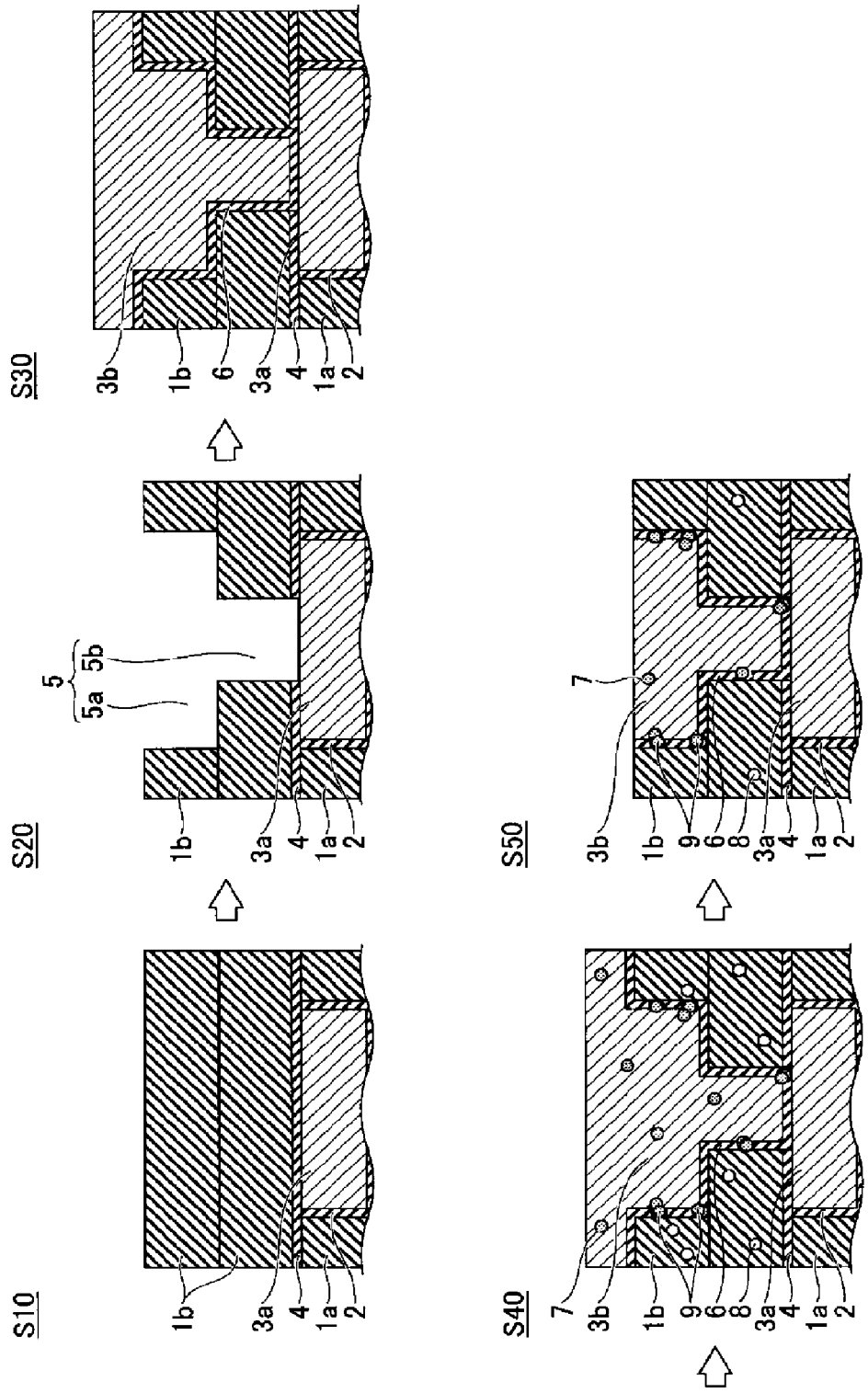
FIG. 1 provides schematic diagrams for describing an example structure of a semiconductor wafer W.

1: Interlayer insulating film
2: Diffusion barrier layer
3a: Wiring layer (First conductive layer)
3b: Wiring layer (Third conductive layer)
4: Diffusion barrier layer (Etching stop layer)
5: Recess
6: Second conductive layer
7: Material solid-soluble in third conductive layer
8: Moisture and/or Oxygen
9: Oxide
10: Semiconductor manufacturing apparatus
34: System controller
W: Semiconductor wafer

DETAILED DESCRIPTION

In the following, example embodiments will be described, and reference is made to the accompanying drawings, which form a part of the description. In the specification, an example structure of a semiconductor wafer W (hereinafter, referred to as "wafer") serving as a substrate in a semiconductor device manufacturing method in accordance with an example embodiment will be explained.

Figure 2:
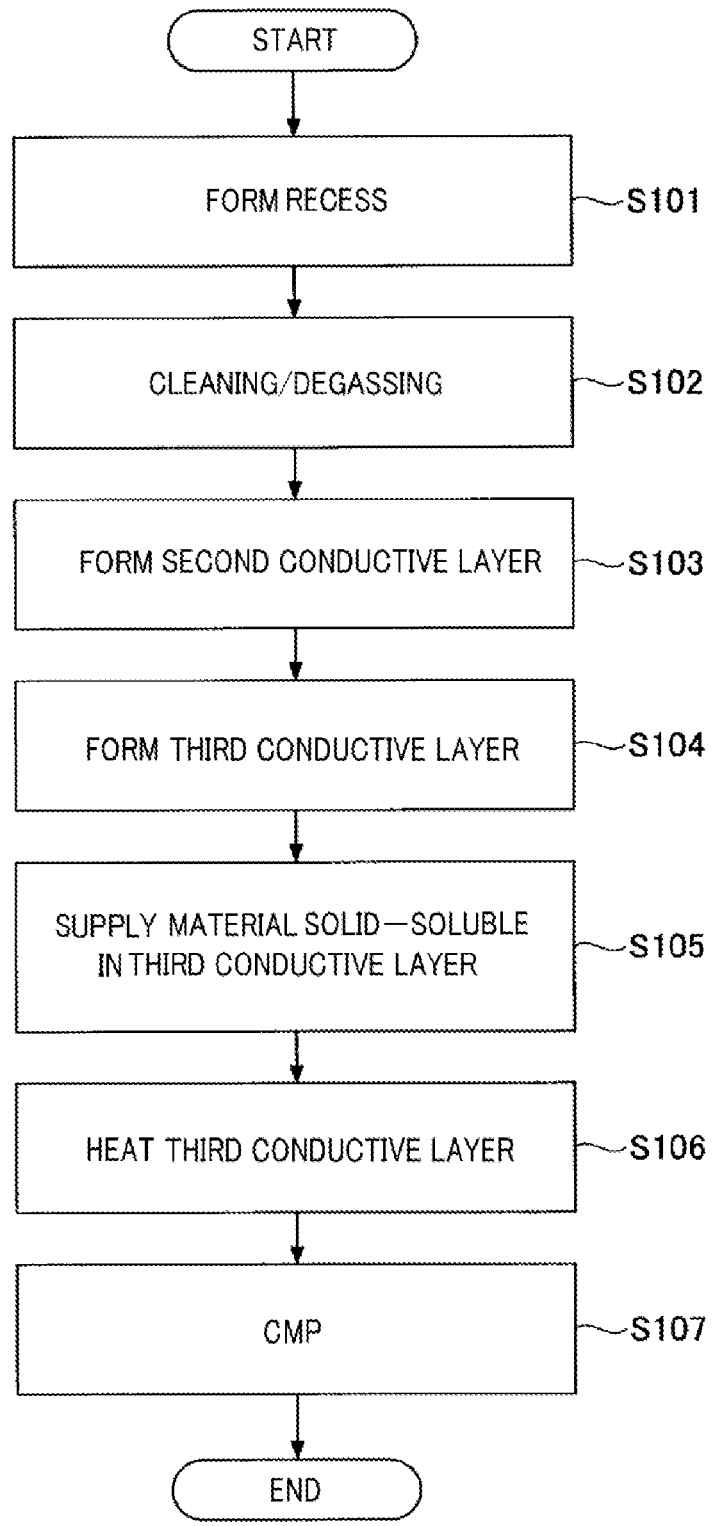
FIG. 2 is an example flowchart for describing a semiconductor device manufacturing method in accordance with the example embodiment.

FIG. 1 is a drawing for describing a semiconductor device manufacturing method in accordance with an example embodiment, and provides schematic diagrams illustrating an example structure of a semiconductor wafer W in respective manufacturing processes. This structure of the semiconductor wafer W shown in FIG. 1 is nothing more than an example and is not intended to be limiting. FIG. 2 depicts an example flowchart for describing a sequence of the semiconductor device manufacturing method in accordance with the example embodiment.

(Form Recess (S101))

As depicted in S10 of FIG. 1, an interlayer insulating film 1a is formed on a lower side of a wafer W. A lower wiring layer 3a (first conductive layer) is formed in the interlayer insulating film 1a with a diffusion barrier layer 2 therebetween.

An interlayer insulating layer 1b is formed on an upper side of the wafer W via a diffusion barrier (etching stop) layer 4 therebetween. A non-illustrated etching stop layer, which is a hard mask, for example, may be formed at a middle position of the interlayer insulating layer 1b in a thickness direction thereof. The etching stop layer serves to set a depth position of a groove 5a forming the recess 5 to be an upper end of the etching stop layer when forming a recess 5 to be described later by an etching process. Further, a non-illustrated sacrificial film made of, but not limited to, a photoresist mask as an organic material or a hard mask as an inorganic material is formed on the interlayer insulating layer 1b in order to form the recess 5 in the interlayer insulating layer 1b.

As shown in S20 of FIG. 1, the recess 5 including the groove (trench) 5a and a via hole (or a through hole) 5b is formed in the interlayer insulating layer 1b by the etching process or the like. Then, the sacrificial film and the etching stop layer 4 remaining at a bottom of the via hole 5b are removed through an etching process or an ashing process, so that a surface of the lower wiring layer 3a is exposed.

A material for the interlayer insulating layer may not be particularly limited, and any material commonly known to be used as the interlayer insulating layer may be utilized. To be specific, a film made of a silicon compound containing silicon (Si) and oxygen (O) or carbon (C) such as a SiO film (e.g., a $SiO_2$ film), a SIOF film (a film containing silicon, oxygen and fluorine), a SiC film (a film containing silicon and carbon), a SiOC film (a film containing silicon, oxygen and carbon), a SiCOH film (a film containing silicon, carbon, oxygen and hydrogen), a SiCN film (a film containing silicon, carbon and nitrogen); a porous silica film; a porous methylsilsesquioxane film; a poly allylene film; a SiLK (registered trademark); or a fluorocarbon film may be used. Further, it may be also possible to use a hybrid structure in which an inorganic film such as a SiOC and an organic film such as poly allylene are stacked. To meet a recent demand for a high-speed operation of a semiconductor device, it may be desirable to use an insulating film having a low relative permittivity. By way of non-limiting example, a lw-k film made of, e.g., SiOC or SiCOH containing an organic group such as a methyl group, or a silicon oxide film formed from tetraethyl orthosilicate (TEOS) may be used, desirably. Further, a single kind of these materials may be used, or two or more kinds of these materials may be used in combination.

As for a structure of the material of the interlayer insulating layer, the interlayer insulating layer may be a dense film or a porous film having fine pores.

The wiring layers (the first conductive layer and the third conductive layer) formed within the interlayer insulating layers in the semiconductor device of the example embodiment may be made of copper (Cu) or a material containing Cu as a principal component (equal to or higher than about 50 weight %), since the Cu has low electromigration and low electric resistance.

The size of the recess 5 may be appropriately selected by those skilled in the art. Typically, an inner diameter of the via hole 5b may be in the range of from, e.g., about 20 nm to about 60 nm with an aspect ratio ranging from, e.g., about 1 to about 5.

(Cleaning/Degassing (S102))

Subsequently, a general degassing process or a cleaning process of cleaning the inside of the recess 5 on the surface of the wafer W is performed. That is, residues adhering to the inside of the recess 5 during the aforementioned ashing process or etching process performed when forming the recess are cleaned to be removed.

As the cleaning process, a wet cleaning process using chemicals, an $H_2$ plasma process, an Ar plasma process, a drying cleaning process using an organic acid, a cleaning process using hot-wire atomic hydrogen, or the like may be performed.

Typically, the exposed surface of the wiring layer 3a may be oxidized into an oxide ($Cu_2O$, etc.) by a damage caused when performing the etching process or ashing process and a contact with oxygen. This copper oxide may be removed by supplying a reducing gas (e.g., $H_2$, $NH_3$, CO, etc.) or vapor of a reducing agent (e.g., a carboxylic acid such as a formic acid which is an organic acid), or the copper oxide may be physically removed by argon (Ar) sputtering. As a result, metal copper is exposed on a bottom surface of the via hole 5b.

(Form Second Conductive Layer (S103))

Thereafter, as depicted in S30 of FIG. 1, at least one second conductive layer 6 to be described below is formed on the upper interlayer insulating layer 1b and the wiring layer 3a (first conductive layer) exposed on the bottom surface of the via hole 5b.

In the present example embodiment, the second conductive layer 6 refers to a layer having preset functions, provided among a wiring layer 3b (a third conductive layer to be described later), and the interlayer insulating layer 1b and the wiring layer 3a. The function required for the second conductive layer 6 may vary depending on the material of the interlayer insulating layer, diameters and aspect ratios of the trench and the via hole (openings), performance required for the semiconductor device, and so forth. According to such function, the second conductive layer may be mainly referred to as a diffusion barrier layer, an adhesion layer, a seed layer, or the like. As in the case where an adhesion layer also serves as a seed layer, a single layer may also have a function of another layer. Thus, the example embodiment is not limiting in this aspect. Further, the second conductive layer may be a single-layered or multi-layered structure.

<Diffusion Barrier Layer (Barrier Layer)>

The Cu contained in the first conductive layer and/or the third conductive layer is highly likely to be diffused into the interlayer insulating layer when it is in direct contact with the interlayer insulating layer. Since the diffusion of the Cu into the interlayer insulating layer may cause an increase of a leakage current, it may be desirable to form a diffusion barrier layer at an interface between the Cu layer and the interlayer insulating layer. The diffusion barrier layer also functions to suppress an increase of the relative permittivity of the interlayer insulating layer and oxidation of the underlying wiring layer due to presence of water or oxygen in the system.

As a material for the diffusion barrier layer, it may be desirable to use a material selected from a group consisting of Ta, TaN, Titanium (Ti), titanium nitride (TiN) and ruthenium (Ru). These materials have good barrier property against Cu, or water and oxygen. Further, the diffusion barrier layer may be a single-layered or multi-layered structure.

<Adhesion Layer>

When forming the wiring layer 3b (the third conductive layer) directly on the interlayer insulating layer, the Cu layer may not be formed with high coverage depending on diameters of the trench or the via hole. For this reason, it may be desirable to form the wiring layer 3b on the interlayer insulating layer with an adhesion layer interposed therebetween.

A material for the adhesion layer may not be particularly limited as long as it has high wettability and high adhesivity to Cu in the wiring layer. By way of non-limiting example, Ru or cobalt (CO) may be desirably utilized. Since a mismatch of a lattice spacing of Ru or Co with respect to Cu is as small as about 3%, it is known that a Ru film or a CO film has high adhesivity to a Cu film (see, for example, Patent Document 2).

<Seed Layer>

A seed layer serves as a layer that would become a conductor when the wiring layer 3b (third conductive layer) is formed by an electroplating method to be described later. Like the adhesion layer as stated above, the seed layer also contributes to forming the wiring layer 3b (third conductive layer) with high coverage.

Further, since the aforementioned adhesion layer or the seed layer is provided between the wiring layer 3b and the interlayer insulating layer 1b, the adhesion layer or the seed layer may also have a function of suppressing Cu from being diffused into the interlayer insulating layer depending on the materials and crystal property thereof.

As a material for the seed layer, any material having high conductivity and corrosion resistance to a plating liquid when forming the wiring layer 3b by the plating method may be employed but not limited thereto. By way of example, Ru or Cu may be used, desirably.

The second conductive layer may be formed by PVD (Physical Vapor Deposition), CVD (Chemical Vapor Deposition), ALD (Atomic Layer Deposition), or the like. In the present example embodiment, the PVD includes all kinds of commonly known PVD methods such as sputtering and vapor-depositing; the CVD includes all kinds of commonly known CVD methods such as thermal CVD, plasma CVD and optical CVD; and the ALD includes all kinds of commonly thermal ALD, plasma ALD and optical ALD. As stated above, when burying a material in a groove portion (a trench or a via hole) of an insulating film, it may be difficult to bury the material with high coverage by the PVD in case of a fine wiring having a trench width equal to or less than, e.g., about 50 nm. Thus, it may be desirable to use the CVD or the ALD to bury the material in the groove portion of the insulating film.

In a first example embodiment, the Ru layer is used as the second conductive layer. Here, the Ru layer has all of the aforementioned three kinds of functions as the barrier layer, the seed layer and the adhesion layer. That is, by using the Ru layer as the second conductive layer, different kinds of films as the barrier layer, the seed layer and the adhesion layer need not be formed additionally. Thus, a manufacturing process can be simplified. Further, in a second example embodiment, a Ta layer and a Ru layer formed on top of the Ta layer are used as the second conductive layer.

In the present example embodiments, the second conductive layer or a surface of the second conductive layer is the Ru layer. It is desirable to form the Ru layer by the CVD or the ALD for the following reasons:

(i) by forming the second conductive layer through the CVD or the ALD, it is possible to bury a material with high coverage even when forming a fine wiring having a trench width of, e.g., about 50 nm or less; and (ii) in case that the third conductive layer to be described later is Cu, it is possible to form the third conductive layer with relatively higher coverage even if the third conductive layer (i.e., the Cu layer) is formed by the PVD, since Cu has high wettability with respect to Ru. Further, since Cu and Ru have good adhesivity to each other, it is expected that it is possible to suppress the films from being peeling off in a subsequent CMP process to be described later.

(Form Third Conductive Layer (S104))

Subsequently, as depicted in S40 of FIG. 1, the upper wiring layer 3b (third conductive layer) is formed on the second conducive layer 6. As described above, it is desirable to use Cu as the wiring layer 3b.

A method of forming the wiring layer 3b may not be particularly limited and various methods such as the electroplating, the PVD or the CVD may be employed.

Typically, after forming the wiring layer 3b by the electroplating, heat treatment (annealing) is performed at about 100° C. for about 1 hour in order to accelerate crystal growth of Cu.

(Supply Material Solid-Soluble in Third Conductive Layer (S105))

A grain boundary exists in the second conductive layer 6 formed on the surface of the interlayer insulating layer 1b and on the surface of the metal copper on the bottom surface of the via hole 5b. The grain boundary is a region where atom arrays are misoriented due to a distortional stress caused by a lattice defect or a compositional change in crystals. Since the grain boundary is a structure having more gaps than the inside of a crystal grain, segregation of impurities may easily occur in the grain boundary. Since the impurities tend to be diffused along the grain boundary at a relatively higher speed, the aforementioned function such as diffusion barrier property or adhesivity may be deteriorated under the presence of the grain boundary. By way of example, in case of using Ru as the material of the second conductive layer 6, if the Ru is single crystalline, the Ru film may have all of the above-described three kinds of functions as the barrier layer, the seed layer and the adhesion layer. However, it is known that an actual Ru film is composed of a columnar crystal. Since a boundary of the columnar crystals serves as the grain boundary, diffusion of molecules and atoms may occur, so that the barrier property is deteriorated. To elaborate, oxygen or moisture contained in the interlayer insulating layer 1b may reach the Cu wiring layer 3b through the Ru grain boundary, so that the Cu may be oxidized. Further, the Cu of the Cu wiring layer 3b may be diffused into the interlayer insulating layer 1b through the Ru grain boundary depending on such a factor as a temperature or a voltage to deteriorate characteristics of a semiconductor device. Especially, in a thin film, the effect of the grain boundary upon the film characteristics may be high. This is because there exist a multiple number of paths for diffusion, called grain boundaries since the thickness of the film is very small and the diameter of grains is small.

Therefore, in the present example embodiment, by supplying a material capable of being dissolved and solidified in the third conductive layer (hereinafter, referred to as "material solid-soluble in third conductive layer") to be described below, and then, performing a heat treatment, the grain boundaries are covered by the material solid-soluble in the third conductive layer or an oxide thereof, so that the aforementioned function may be achieved.

As the material solid-soluble in the third conductive layer, it is desirable to use a material solid-soluble in the third conductive layer and whose oxide has diffusion barrier property against the third conductive layer. Specifically, when using Cu as the third conductive layer, aluminum (Al), germanium (Ge), indium (In), magnesium (Mg), Mn, nickel (Ni), Si, tin (Sn), Ti, or the like may be utilized. One kind of these materials may be used individually, or two or more kinds of these materials may be used in combination.

Among the aforementioned materials, it is desirable to use Mn as the material solid-soluble in the third conductive layer. Advantages of using Mn as the material solid-soluble in the third conductive layer are as follows:

(i) Mn has a relatively higher diffusion rate into Cu;

(ii) Mn is more stable when it is not in Cu than when it is in Cu. Thus, besides having the high diffusion rate in Cu, Mn tends to be easily released from Cu through the heat treatment performed after supplying the Mn. Further, Mn may be preferentially supplied into the grain boundaries of the second conductive layer, so that it is possible to suppress a wiring resistance from being increased; and (iii) Mn has higher standard Gibbs energy of formation of an oxide, as compared to Si.

That is, thermodynamically, Mn does not reduce $SiO_2$ used in the interlayer insulating layer or the like and does not incur diffusion of atomic Si into Cu.

From the above-stated reasons, Mn is used in the present example embodiment. However, the example embodiment may not be limited thereto.

As shown in S50 of FIG. 1, the supplied material 7 solid-soluble in the third conductive layer is diffused into the third conductive layer to reach a grain boundary. A part of the material 7 (e.g., Mn) having reached the grain boundary is oxidized into an oxide 9 by moisture and oxygen 8 in the interlayer insulating layer 1*b*. As the aforementioned material 7 turns into the oxide 9, its diffusion rate is remarkably reduced. As a result, the oxide 9 stays where it is, so that it serves as a hard crust that covers the grain boundaries. As stated above, the aforementioned oxide of the material solid-soluble in the third conductive layer has the diffusion barrier property against Cu. Therefore, the diffusion of Cu into the interlayer insulating layer through the grain boundary may be suppressed.

Further, in case of using Cu as the third conductive layer while using Mn as the solid-soluble material, the Cu layer becomes a Cu—Mn alloy layer as a result of supplying the Mn. As compared to pure Cu, the Cu—Mn alloy layer has improved electromigration resistance. Further, as discussed above, Mn tends to be easily released from Cu as compared to other materials. Thus, by performing the annealing process after supplying Mn, Mn having higher resistivity than Cu can be suppressed from remaining in Cu in an amount more than required, so that the increase of the wiring resistance can be avoided.

As a method of supplying the material 7 solid-soluble in the third conductive layer, a PVD method or a CVD method may be employed. By way of example, in case of using the PVD method, it may be desirable to supply the material 7 by the sputtering or the vapor deposition with a target containing the material 7. By way of non-limiting example, when supplying Mn, a pure Mn target, a Mn—Cu alloy target, or the like may be used as the target. Since a precursor is not used in the PVD method, the method of using the PVD method has an advantage in that it does not accompany contamination that might be caused by carbon originated from a precursor in the film.

Meanwhile, in case of supplying the material 7 solid-soluble in the third conductive layer by using the CVD method, the material 7 can be supplied by exposing a gas containing the material 7 to the wafer W with a commonly known precursor containing the material 7. When using Mn as the supplied material 7, an example of a precursor containing Mn may be one or more kinds of materials selected from a group consisting of an amide amino alkane-based manganese compound such as bis(N,N'-1-alkylamide-2-dialkylaminoalkane)manganese represented by a general formula of $Mn(R^1N-Z-NR^2{}_2)_2$ described in International Publication No. 2012/060428 (in this general formula, $R^1$ and $R^2$ denotealkyl groups represented by $C_nH_{2n+1}$ (n is an integer equal to and larger than 0), and Z denotes an alkylene group represented by $C_mH_{2m}$ (m is an integer equal to and larger than 0)), $Cp_2Mn[=Mn(C_5H_5)_2]$, $(MeCp)_2Mn[=Mn(CH_3C_5H_4)_2]$, $(Me_5Cp)_2Mn[=Mn((CH_3)_5C_5H_4)_2]$, $(EtCp)_2Mn[=Mn(C_2H_5C_5H_4)_2]$, $(i-PrCp)_2Mn[=Mn(C_3H_7C_3H_4)_2]$, $(t-BuCp)_2Mn[=Mn(C_4H_9C_5H_4)_2]$, $MeCpMn(CO)_3[=(CH_3C_5H_4)Mn(CO)_3]$, $MeMn(CO)_3[=(CH_3)Mn(CO)_5]$, $Mn_2(CO)_{10}$, $Mn(DPM)_2[=Mn(C_{11}H_{19}O_2)_2]$, $Mn(DPM)_3[=Mn(C_{11}H_{19}O_2)_3]$, $Mn(DMPD)(EtCp)[=Mn(C_7H_{11}C_2H_3C_3H_4)]$, $Mn(acac)_2[=Mn(C_5H_7O_2)_2]$, $Mn(acac)_3[=Mn(C_5H_7O_2)_3]$, $Mn(hfac)_2[=Mn(C_5HF_6O_2)_3]$, $[Mn(iPr-AMD)_2][=Mn(C_3H_7NC(CH_3)NC_3H_7)_2]$, and $[Mn(tBu-AMD)_2][=Mn(C_4H_9NC(CH_3)NC_4H_9)_2]$. Among these precursors, it may be desirable to select a precursor in which Cp (cyclopentadiene) is included, and Cp and Mn are bonded by the π(Pi) bonds. The reason is as follows: in case that the third conductive layer is Cu, the π bond may be broken even at a relatively lower temperature lower than or equal to a thermal decomposition temperature of the precursor through the catalyst effect of Cu, so that the released Mn atoms may be easily diffused into the Cu. By way of example, in case of using $(EtCp)_2Mn$ described above as the precursor, the thermal decomposition temperature of this precursor is about 450° C. However, it is observed that this precursor is easily decomposed on Cu at a temperature of about 250° C., so that the released Mn is easily diffused into the Cu.

Further, the material 7 solid-soluble in the third conductive layer can be supplied by the PVD method or the CVD method while heating the wafer W, so that heating (heat treatment) of the third conductive layer to be describe below can be concurrently performed at this stage.

(Heat (Heat-Treat) Third Conductive Layer (S106))

While or after supplying the material solid-soluble in the third conductive layer, the third conductive layer is heat-treated (annealed). Desirably, an annealing temperature may be equal to or higher than, e.g., about 50° C. and, more desirably, in a range of equal to or higher than, e.g., about 100° C. to equal to or smaller than, e.g., about 400° C. Duration of the annealing process may be appropriately set depending on the annealing temperature and a film thickness of the third conductive layer. As a specific example, when the annealing temperature is about 200° C., by performing the annealing process on the Cu layer having a thickness of, e.g., about 100 nm for about 10 minutes, Mn supplied onto the Cu layer may be diffused into the Cu layer having the thickness of about 100 nm, and then, may reach an interface between the Cu layer and the insulating film. That is, the aforementioned annealing process may accelerate diffusion of the material 7 solid-soluble in the third conductive layer into the third conductive layer.

In the present example embodiment, the material solid-soluble in the third conductive layer is diffused into the third conductive layer. By using this diffusion, the material 7 solid-soluble in the third conductive layer can be uniformly diffused into the third conductive layer even in case of a fine wiring having a trench width of, e.g., about 50 nm or less. Thus, the material 7 can be supplied with high coverage. That is, the material 7 can be surely supplied to the grain boundaries in the second conducive layer. As stated above, at least a part of the supplied material 7 may be oxidized by the moisture or the oxygen in the interlayer insulating layer. This annealing process may also be performed after the third conductive layer is formed (S104).

During this heat treatment, to accelerate the diffusion of the material 7 into the Cu and adjust a concentration of the material 7 in the Cu, it is desirable to control an oxygen partial pressure in the system to be, e.g., about 10 ppb or less. If the oxygen partial pressure in the system exceeds this pressure range, Mn may be firstly oxidized before the Mn is diffused into the Cu sufficiently, resulting in formation of $MnO_x$ on the surface of the Cu. Meanwhile, if the oxygen partial pressure falls within the aforementioned pressure range, at least a part of the Mn may be diffused into the Cu, and $MnO_x$ may be formed at the grain boundaries of the second conductive layer, so that the effect of the present example embodiment may be achieved.

Here, the method of the present example embodiment and a method of a comparative example will be compared. The comparative example will be described for the processes of forming a second conductive layer (S103); supplying a material solid-soluble in the third conductive layer (S105); and then, forming a third conductive layer (S104). Here, the description will be provided for the case where Ru is used as the second conductive layer; Mn is used as the material solid-soluble in the third conductive layer; and Cu is used as the third conductive layer. In the comparative example, since Mn is directly deposited on Ru, a Mn layer needs to be formed by the CVD or the ALD in consideration of a coverage characteristic. As of now, since a high temperature equal to or higher than about 400° C. is required for allowing a Mn-containing film deposited by the CVD to be a metal Mn, it is difficult to use the CVD for forming the Cu wiring. Meanwhile, there is no example in a case that the metal Mn is formed by the ALD. Through the ALD, $MnO_x$ is formed. Thus, in the comparative example, $MnO_x$ is deposited on Ru. Further, since the $MnO_x$ is deposited not only at the grain boundaries of Ru but also at areas other than the grain boundaries, a cross section of Cu in the via hole may be relatively smaller, resulting in an increase of resistance. Further, it is known that Cu on the oxide has low wettability. Thus, the comparative example of forming the Cu on the $MnO_x$ may be disadvantageous in the aspect of the coverage characteristic or the adhesivity.

Meanwhile, in the method of the present example embodiment, after Cu is deposited on Ru, Mn is supplied and the heat treatment is performed. Since Cu (especially, Cu with little impurity) on Ru has higher wettability, it is possible to obtain the relatively higher coverage even by the PVD method or the like. Further, since the heat treatment is performed after the Mn is supplied, Mn atoms are allowed to be diffused into the Cu. As a result, the Mn atoms are preferentially deposited at the grain boundaries of Ru, and a part of them are oxidized to be $MnO_x$. Accordingly, since a necessary minimum amount of Mn is supplied only to necessary areas, it is possible to achieve the high coverage characteristic, the barrier property and the adhesivity without accompanying the increase of the wiring resistance of Cu.

(CMP (S107))

After the material 7 is supplied, the residual wiring layer 3b and the second conductive layer 6 on the top surface are removed from the wafer W by the CMP (Chemical Mechanical Polishing).

The semiconductor device manufacturing method as described above includes: forming a second conductive layer on an underlying layer which has an insulating film in which a recess is formed and a first conductive layer exposed on a bottom surface of the recess; forming a third conductive layer on the second conductive layer; supplying a material solid-soluble in the third conductive layer into the third conductive layer; and heating the third conductive layer into which the solid-soluble material is supplied. The material solid-soluble in the third conductive layer is diffused into the third conductive layer through an annealing process and reaches the grain boundaries of the second conductive layer. At least a part of the material solid-soluble in the third conductive layer having reached the grain boundaries reacts with moisture and oxygen of the insulating layer having passed through the grain boundaries of the second conductive layer to be an oxide. The oxide of the material solid-soluble in the third conductive layer has diffusion barrier property against the third conductive layer. Accordingly, according to the semiconductor device manufacturing method of the present example embodiment, it is possible to bury a wiring material (e.g., Cu) in a groove of an insulating film with high coverage for various sizes of trenches and hole patterns on a semiconductor wafer. Furthermore, it is also possible to suppress the wiring material from being diffused into the insulating film.

(Semiconductor Manufacturing Apparatus)

Figure 3:
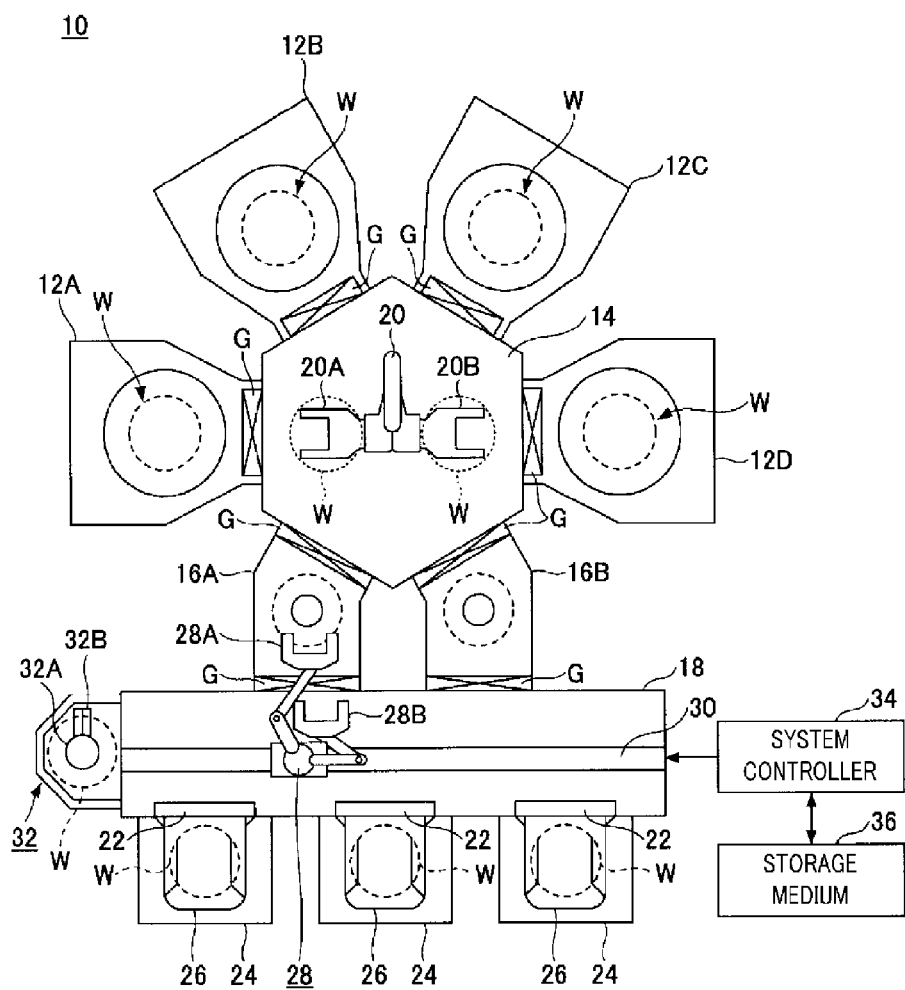
FIG. 3 is a schematic configuration diagram illustrating an example configuration of the semiconductor manufacturing apparatus in accordance with the example embodiment.

A semiconductor manufacturing apparatus configured to perform the semiconductor device manufacturing method in accordance with the above-described example embodiments will be explained. FIG. 3 is a schematic configuration view illustrating an example semiconductor manufacturing apparatus in accordance with the example embodiments. The semiconductor manufacturing apparatus shown in FIG. 3 is configured to process a wafer having a recess 5 formed on a surface thereof (i.e., a wafer after S101 in FIG. 2).

The semiconductor manufacturing apparatus 10 mainly includes a multiple number of, e.g., four processing devices 12A, 12B, 12C and 12D; a common transfer chamber 14 having a substantially hexagonal shape; a first load lock chamber 16A and a second load lock chamber 16B each having a load lock function; and a long and narrow inlet-side transfer chamber 18.

As one example, among the four processing devices 12A to 12D, the first processing device, e.g., the processing device 12A is configured to perform a pre-treatment such as cleaning or degassing on a semiconductor wafer W serving as a processing target object; the second processing device, e.g., the processing device 12B is configured to form the above-stated second conductive layer on the semiconductor wafer W; the third processing device, e.g., the processing device 12C is configured to deposit the third conductive layer buried in the recess of the semiconductor wafer W; and the fourth processing device, e.g., the processing device 12D is configured to supply the material solid-soluble in the third conductive layer, such as Mn, onto the semiconductor wafer W.

Here, depending on the structure of the second conductive layer, a fifth processing device 12E, a sixth processing device 12F, etc, connected to the common transfer chamber 14 may be additionally provided.

The first processing device 12A may be implemented by a commonly known general cleaning device, and the second processing device 12B, the third processing device 12C and the fourth processing device 12D may be implemented by commonly known film forming devices for the CVD, the PVD, or the like as described above. Thus, their description will be omitted herein.

The processing devices 12A to 12D are connected to four sides of the common transfer chamber 14, respectively, and the first load lock chamber 16A and the second load lock chamber 16B are connected to the remaining two sides of the common transfer chamber 14, respectively. The inlet-side chamber 18 is connected to the first load lock chamber 16A and the second load lock chamber 16B.

Gate valves G configured to be hermetically opened and closed are provided between the common transfer chamber 14 and the respective processing devices 12A to 12D and between the common transfer chamber 14 and the first load lock chamber 16A and the second load lock chamber 16B, respectively. With this configuration, the processing devices and the load lock chambers can be allowed to communicate with the inside of the common transfer chamber 14 when necessary. Further, the gate valves G configured to be hermetically opened and closed are also provided between the first and second load lock chambers 16A and 16B and the inlet-side transfer chamber 18, respectively. The first load lock chamber 16A and the second load lock chamber 16B may be evacuated to a vacuum level, and returned back to an atmospheric pressure repeatedly when loading and unloading the wafer.

Within the common transfer chamber 14, a transfer device 20 implemented by a multi-joint arm configured to be contractible/extendible and rotatable is provided at a position where it is capable of accessing each of the load lock chambers 16A and 16B and each of the processing devices 12A to 12D. The transfer device 20 has two picks 20A and 20B capable of independently contracting and extending in opposite directions to each other and the transfer device 20 can handle two sheets of wafers at one time. Alternatively, the transfer device 20 may have a single pick.

The inlet-side transfer chamber 18 has, but not limited to, a horizontally elongated box shape. One or more (three in FIG. 3) loading openings through which the semiconductor wafer as the processing target object is loaded/unloaded are formed at one of two long sides of the inlet-side transfer chamber 18. An opening/closing door 22 configured to be opened and closed is provided at each of the loading openings. Further, an inlet port 24 is provided for each of the loading openings, and each inlet port 24 is configured to mount thereon a single cassette container 26.

Each cassette container 26 is configured to accommodate therein a multiple number of, e.g., 25 sheets of wafers W which are stacked in multiple levels at the same pitch. The inside of the cassette container 26 is hermetically sealed and filled with an atmosphere of an inert gas such as an $N_2$ gas.

An inlet-side transfer device 28 configured to transfer the wafer W in a lengthwise direction of the transfer chamber 18 is provided within the inlet-side transfer chamber 18. The inlet-side transfer device 28 has two picks 28A and 28B configured to be contractible/extendible and rotatable, and the inlet-side transfer device 28 is capable of handling two sheets of wafers W at one time. The inlet-side transfer device 28 is slidably supported on a guide rail 30 extended within the inlet-side transfer chamber 18 in the lengthwise direction thereof.

Further, an orienter 32 configured to adjust a position of a wafer is provided at one end of the inlet-side transfer chamber 18. The orienter 32 includes a rotating table 32A configured to mount thereon the wafer W and to be rotated by a driving motor while mounting thereon the wafer W. An optical sensor 32B configured to detect a periphery of the wafer W is provided at an outer periphery of the rotating table 32A. By providing the optical sensor 32B, it is possible to detect a position determination mark of the wafer W such as, but not limited to, a notch, a positional direction of an orientation flat, or a deviation amount of a center position of the wafer W.

The semiconductor manufacturing apparatus 10 includes a system controller 34 having a computer, for example. Programs required to control the overall operations of the semiconductor manufacturing apparatus 10 are stored in a storage medium 36 such as a flexible disk, a CD (Compact Disk), a hard disk or a flash memory. To elaborate, start or stop of supply of each gas, control of a flow rate of each gas, control of a process temperature (a wafer temperature) and a process pressure (a pressure within a processing chamber of each processing device), transfer of wafers, and so forth are performed in response to instructions from the system controller 34. Further, processes performed in the first processing device 12A to the fourth processing device 12D may be implemented under the control of the system controller 34. Alternatively, non-illustrated system controllers may be provided in the first processing device 12A to the fourth processing device 12D, respectively, and the processes performed in the processing devices 12A to 12D may be implemented under the control of the system controllers, respectively.

An operation example of the semiconductor manufacturing apparatus 10 will be explained. First, an unprocessed semiconductor wafer W is transferred into the inlet-side transfer chamber 18 by the inlet-side transfer device 28 from the cassette container 26 provided on the inlet port 24. Then, the wafer W is loaded into the orienter 32 provided at one end of the inlet-side transfer chamber 18, and a position of the wafer W is determined.

Thereafter, the position-determined wafer W is transferred again by the inlet-side transfer device 28, and then, loaded into either one of the load lock chambers 16A and 16B. After the inside of the load lock chamber is evacuated, the wafer W is transferred into the common transfer chamber 14 from the load lock chamber by the transfer device 20 within the common transfer chamber 14 which has been previously evacuated.

Then, the wafer W transferred into the common transfer chamber 14 is loaded into the first processing device 12A to the fourth processing device 12D to be subjected to the respective processes of the semiconductor device manufacturing method as described above.

From the foregoing, it will be appreciated that various embodiments of the present disclosure have been described herein for purposes of illustration and are not intended to be limiting, and that various modifications may be made. By way of example, the method of forming the gate insulating film in accordance with the example embodiment may also be applicable to a method of forming a capacitive insulating film (capacitor capacitive film) of a capacitor. Further, in the above-described embodiment, the silicon wafer (silicon substrate) is used as a processing target object. However, other kinds of semiconductor substrates may also be used.

This international application claims priority to Japanese Patent Application No. 2012-036735, filed on Feb. 22, 2012, which application is hereby incorporated by reference in its entirety.

We claim:
1. A semiconductor device, comprising:
   an underlying layer having an insulating layer in which a recess is formed and a first conductive layer exposed on a bottom surface of the recess;
   a Ru layer formed on the underlying layer; and
   a Cu layer formed on the Ru layer,
   wherein a grain boundary in the Ru layer is covered with an Mn oxide.

* * * * *

UNITED STATES PATENT AND TRADEMARK OFFICE
CERTIFICATE OF CORRECTION

PATENT NO. : 9,240,379 B2  
APPLICATION NO. : 14/464875  
DATED : January 19, 2016  
INVENTOR(S) : Matsumoto et al.

Page 1 of 1

It is certified that error appears in the above-identified patent and that said Letters Patent is hereby corrected as shown below:

In the specification,

Column 7, line 66, please replace "$MeMn(CO)_3$" with -- $MeMn(CO)_5$ --

Column 8, line 2, please replace "$Mn(C_7H_{11}C_2H_3C_3H_4)]$" with -- $Mn(C_7H_{11}C_2H_5C_5H_4)]$ --

Signed and Sealed this  
Twenty-sixth Day of April, 2016

Michelle K. Lee  
*Director of the United States Patent and Trademark Office*